United States Patent
Hung et al.

(10) Patent No.: US 9,093,463 B1
(45) Date of Patent: Jul. 28, 2015

(54) SILICON CONTROLLED RECTIFIER FOR PROVIDING ELECTROSTATIC DISCHARGE PROTECTION FOR HIGH VOLTAGE INTEGRATED CIRCUITS

(71) Applicant: Richtek Technology Corporation, Chupei, Hsinchu (TW)

(72) Inventors: Chung-Yu Hung, Changhua County (TW); Jian-Hsing Lee, Chiayi County (TW); Tzu-Cheng Kao, Hsinchu County (TW); Tsung-Yi Huang, Hsinchu (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 14/537,424

(22) Filed: Nov. 10, 2014

(30) Foreign Application Priority Data

Apr. 23, 2014 (TW) .............................. 103114653 A

(51) Int. Cl.
*H01L 21/336* (2006.01)
*H01L 29/66* (2006.01)
*H01L 29/737* (2006.01)

(52) U.S. Cl.
CPC ......... *H01L 29/66393* (2013.01); *H01L 29/737* (2013.01)

(58) Field of Classification Search
CPC .............. H01L 21/336; H01L 27/0262; H01L 27/0259; H01L 27/0921; H01L 27/0629; H01L 29/66393; H01L 29/7436; H01L 29/87; H01L 29/737
USPC ......... 257/119, 139, 154, 162, 173, 355, 401, 257/487, E27.016, 21.417
See application file for complete search history.

(56) References Cited

U.S. PATENT DOCUMENTS

| | | | |
|---|---|---|---|
| 6,720,622 B1 * | 4/2004 | Yu ................................. | 257/355 |
| 8,772,091 B2 * | 7/2014 | Salcedo et al. ................ | 438/133 |
| 2003/0042498 A1 * | 3/2003 | Ker et al. ........................ | 257/173 |
| 2003/0222273 A1 * | 12/2003 | Kunz et al. .................... | 257/119 |
| 2004/0085691 A1 * | 5/2004 | Ker et al. ........................ | 361/56 |
| 2005/0151160 A1 * | 7/2005 | Salcedo et al. ................ | 257/173 |
| 2006/0258067 A1 * | 11/2006 | Jeon et al. ...................... | 438/154 |
| 2010/0163924 A1 * | 7/2010 | Lin et al. ........................ | 257/162 |
| 2010/0207163 A1 * | 8/2010 | Yabu et al. ..................... | 257/173 |
| 2011/0204415 A1 * | 8/2011 | Van Wijmeersch et al. .. | 257/154 |
| 2012/0256229 A1 * | 10/2012 | Chen .............................. | 257/139 |
| 2013/0341676 A1 * | 12/2013 | Lee et al. ....................... | 257/148 |
| 2014/0299912 A1 * | 10/2014 | Lin et al. ........................ | 257/119 |
| 2015/0060941 A1 * | 3/2015 | Hwang .......................... | 257/173 |

* cited by examiner

*Primary Examiner* — Michael Lebentritt
(74) *Attorney, Agent, or Firm* — Birch, Stewart, Kolasch & Birch, LLP

(57) ABSTRACT

A silicon controlled rectifier includes: a substrate; a N well and a P well positioned on a side of the substrate and contact with each other; a first N region and a first P region positioned on an upper surface of the N well and contact with each other; a second N region and a second P region positioned on an upper surface of the P well and contact with each other; a first oxide isolation region isolating the first P region and the second N region; a second oxide isolation region isolating the second N region and the second P region; an anode terminal coupled with the first N region and the first P region; and a cathode terminal coupled with the second N region and the second P region. The first P region has a doping concentration less than 80% of that of the second P region.

8 Claims, 1 Drawing Sheet

US 9,093,463 B1

SILICON CONTROLLED RECTIFIER FOR PROVIDING ELECTROSTATIC DISCHARGE PROTECTION FOR HIGH VOLTAGE INTEGRATED CIRCUITS

CROSS-REFERENCE TO RELATED APPLICATIONS

This application claims the benefit of priority to Patent Application No. 103114653, filed in Taiwan on Apr. 23, 2014; the entirety of which is incorporated herein by reference for all purposes.

BACKGROUND

The disclosure generally relates to an electrostatic discharge (ESD) protection device and, more particularly, to a silicon controlled rectifier (SCR) for providing electrostatic discharge protection for high voltage integrated circuits.

In related art, the silicon controlled rectifier (SCR) is often employed as an electrostatic discharge (ESD) protection device. Since positive feedback effect occurs during the operation of a traditional silicon controlled rectifier, the silicon controlled rectifier usually has a low holding voltage, and thus the traditional silicon controlled rectifier can only be employed as the ESD protection device for integrated circuits whose operating voltage is lower than 5V.

In traditional, the holding voltage of the silicon controlled rectifier may be raised by increasing the channel length or by using other extra auxiliary circuits. However, the size of the silicon controlled rectifier would be inevitably increased as the channel length of the silicon controlled rectifier increases, and the circuitry complexity and hardware cost would be increased when other extra auxiliary circuits are employed. Apparently, the above two traditional solutions are not ideal solutions.

SUMMARY

An example embodiment of a silicon controlled rectifier is disclosed, comprising: a substrate; a N well positioned on a first side of the substrate; a P well positioned on the first side of the substrate and contact with the N well; a first N region positioned on an upper surface of the N well; a first P region positioned on the upper surface of the N well and contact with the first N region; a second N region positioned on an upper surface of the P well; a second P region positioned on the upper surface of the P well; a first oxide isolation region positioned on both partial region of the upper surface of the N well and partial region of the upper surface of the P well, and isolating the first P region and the second N region; a second oxide isolation region positioned on partial region of the upper surface of the P well and isolating the second N region and the second P region; an anode terminal coupled with the first N region and the first P region; and a cathode terminal coupled with the second N region and the second P region; wherein the first P region has a doping concentration less than 80% of a doping concentration of the second P region.

Both the foregoing general description and the following detailed description are examples and explanatory only, and are not restrictive of the invention as claimed.

DETAILED DESCRIPTION

Figure 1:
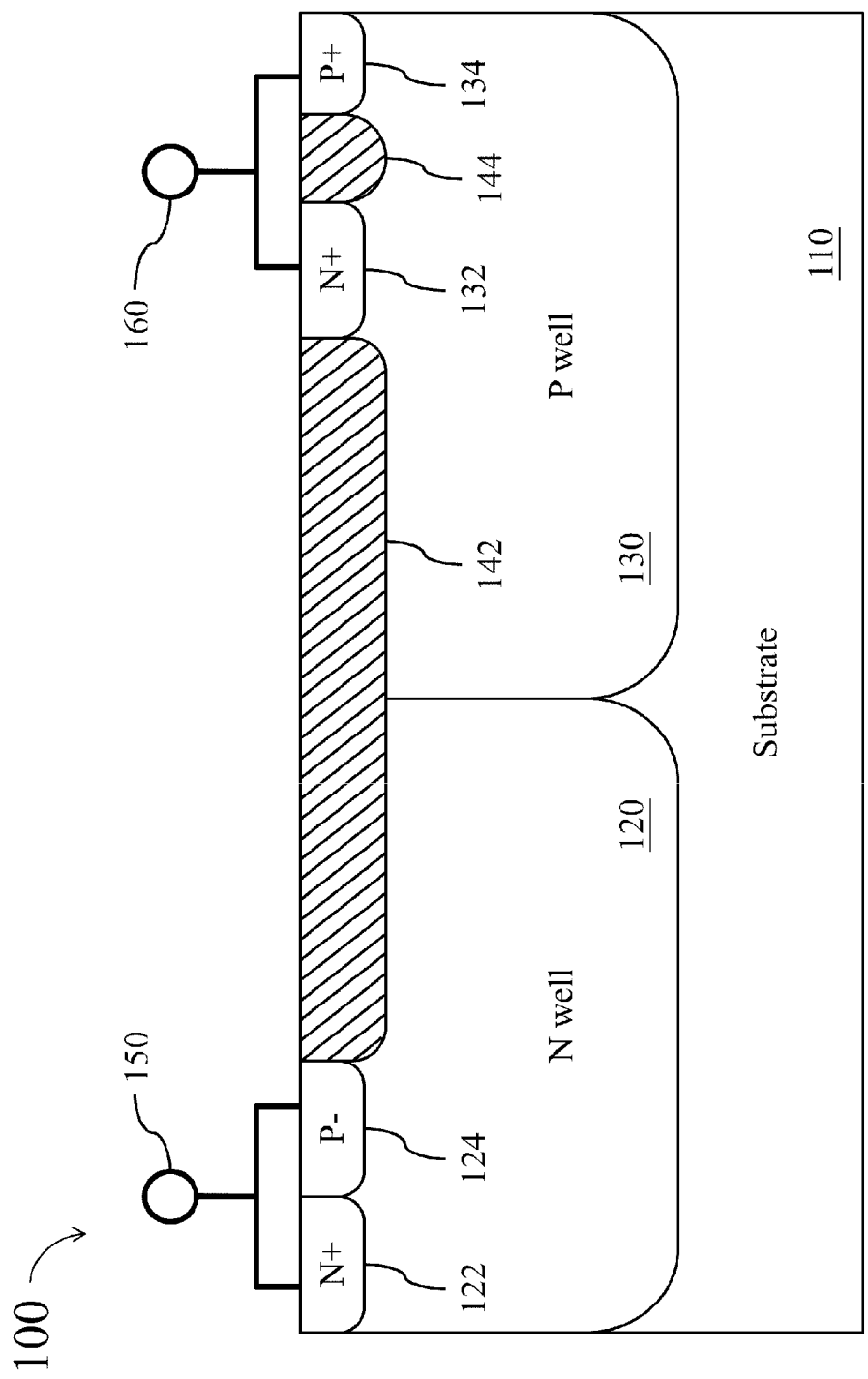
FIG. 1 shows a simplified cross-section diagram of a silicon controlled rectifier according to one embodiment.

Reference is made in detail to embodiments of the invention, which are illustrated in the accompanying drawings. The same reference numbers may be used throughout the drawings to refer to the same or like parts, components, or operations.

FIG. 1 shows a simplified cross-section diagram of a silicon controlled rectifier 100 according to one embodiment. The silicon controlled rectifier 100 comprises a substrate 110, a N well 120, a P well 130, a first N region (i.e., N-type doped region) 122, a first P region (i.e., P-type doped region) 124, a second N region 132, a second P region 134, a first oxide isolation region 142, a second oxide isolation region 144, an anode terminal 150, and a cathode terminal 160.

As shown in FIG. 1, the N well 120 is positioned on a first side of the substrate 110. The P well 130 is positioned on the first side of the substrate 110 and contact with the N well 120. The first N region 122 is positioned on an upper surface of the N well 120. The first P region 124 is positioned on the upper surface of the N well 120 and contact with the first N region 122. Each of the second N region 132 and the second P region 134 is positioned on an upper surface of the P well 130. The first oxide isolation region 142 is positioned on both partial region of the upper surface of the N well 120 and partial region of the upper surface of the P well 130, and isolates the first P region 124 and the second N region 132. The second oxide isolation region 144 is positioned on the upper surface of the P well 130 and isolates the second N region 132 and the second P region 134. The anode terminal 150 is coupled with the first N region 122 and the first P region 124. The cathode terminal 160 is coupled with the second N region 132 and the second P region 134.

In practice, the N well 120 and the P well 130 may be positioned directly on the first side of the substrate 110. Alternatively, the N well 120 and the P well 130 may be positioned above the first side of the substrate 110 with other layer (e.g., isolation layer) spaced between the substrate 110 and the N well 120 or the P well 130. In addition, each of the aforementioned first N region 122 and second N region 132 is a N+ region (i.e., a heavily doped N region), and the second P region 134 is a P+ region (i.e., a heavily doped P region). The substrate 110 may be realized with a N buried layer or a P buried layer.

In order to increase the holding voltage of the silicon controlled rectifier 100, the doping concentration of the first P region 124 may be designed to be lower than 80% of the doping concentration of the second P region 134. In one embodiment, the doping concentration of the first P region 124 may be designed to be lower than two-third of the doping concentration of the second P region 134 to further increase the holding voltage of the silicon controlled rectifier 100.

In another embodiment, the doping concentration of the first P region 124 may be designed to be lower than one-third of the doping concentration of the second P region 134 to further increase the holding voltage of the silicon controlled rectifier 100.

For example, the doping concentration of the first P region 124 may be designed to be ranging from 1E13 ions per cubic centimeter to 1E14 ions per cubic centimeter, and the doping concentration of the second P region 134 may be designed to be greater than 3E14 ions per cubic centimeter.

In practice, the first P region 124 may be realized with a P− region (i.e., a lightly doped P region).

In the foregoing embodiments, since the doping concentration of the first P region 124 in the silicon controlled rectifier 100 is lower than 80%, two-third, or even one-third of the doping concentration of the second P region 134, the quantity of the electron holes in the channel of the silicon controlled rectifier 100 can be lowered, thereby effectively raising the holding voltage of the silicon controlled rectifier 100 without increasing the channel length of the silicon controlled rectifier 100 or using other extra auxiliary circuits.

As a result, the silicon controlled rectifier 100 is enabled to have a holding voltage higher than the operating voltage of many integrated circuits, and thus the silicon controlled rectifier 100 can be employed as the ESD protection device for many high-voltage integrated circuits whose operating voltage is greater than 10V. For example, the silicon controlled rectifier 100 may be employed as the ESD protection device for a power pin of a high-voltage integrated circuit whose operating voltage is greater than 10V by coupling the anode terminal 150 of the silicon controlled rectifier 100 with the power pin while coupling the cathode terminal 160 with a grounded terminal.

In other words, the structure of the disclosed silicon controlled rectifier 100 greatly expands the applications of the silicon controlled rectifier 100, so that the silicon controlled rectifier 100 can be more widely employed in ESD protection applications for various high-voltage integrated circuits.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Throughout the description and claims, the term "element" contains the concept of component, layer, or region.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

For the purpose of explanatory convenience in the specification, spatially relative terms, such as "on," "above," "below," "beneath," "higher," "lower," "upward," "downward," and the like, may be used herein to describe the function of a particular element or to describe the relationship of one element to another element(s) as illustrated in the drawings. It will be understood that the spatially relative terms are intended to encompass different orientations of the element in use, in operations, or in assembly in addition to the orientation depicted in the drawings. For example, if the element in the drawings is turned over, elements described as "on" or "above" other elements would then be oriented "under" or "beneath" the other elements. Thus, the exemplary term "beneath" can encompass both an orientation of above and beneath.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A silicon controlled rectifier, comprising:
   a substrate;
   a N well positioned on a first side of the substrate;
   a P well positioned on the first side of the substrate and contact with the N well;
   a first N region positioned on an upper surface of the N well;
   a first P region positioned on the upper surface of the N well and contact with the first N region;
   a second N region positioned on an upper surface of the P well;
   a second P region positioned on the upper surface of the P well;
   a first oxide isolation region positioned on both partial region of the upper surface of the N well and partial region of the upper surface of the P well, and isolating the first P region and the second N region;
   a second oxide isolation region positioned on partial region of the upper surface of the P well and isolating the second N region and the second P region;
   an anode terminal coupled with the first N region and the first P region; and
   a cathode terminal coupled with the second N region and the second P region;
   wherein the first P region has a doping concentration less than 80% of a doping concentration of the second P region.

2. The silicon controlled rectifier of claim 1, wherein the substrate is a N buried layer.

3. The silicon controlled rectifier of claim 1, wherein the N well and the P well are positioned directly on the first side of the substrate.

4. The silicon controlled rectifier of claim 1, wherein the N well and the P well are positioned above the first side of the substrate.

5. The silicon controlled rectifier of claim 1, wherein the doping concentration of the first P region is less than one-third of the doping concentration of the second P region.

6. The silicon controlled rectifier of claim 1, wherein the doping concentration of the first P region ranges from 1E13 ions per cubic centimeter to 1E14 ions per cubic centimeter, and the doping concentration of the second P region is greater than 3E14 ions per cubic centimeter.

7. The silicon controlled rectifier of claim 1, wherein each of the first N region and the second N region is a N+ region, and the second P region is a P+ region.

8. The silicon controlled rectifier of claim 1, wherein the first P region is a P− region.

* * * * *